(12) United States Patent
Hwang et al.

(10) Patent No.: US 12,740,073 B2
(45) Date of Patent: Sep. 15, 2026

(54) MEMORY DEVICE AND MANUFACTURING METHOD THEREOF

(71) Applicant: SEOUL NATIONAL UNIVERSITY R&DB FOUNDATION, Seoul (KR)

(72) Inventors: Cheol Seong Hwang, Seoul (KR); Joong Chan Shin, Gyeonggi-do (KR)

(73) Assignee: Seoul National University R&DB foundation, Seoul (KR)

(*) Notice: Subject to any disclaimer, the term of this patent is extended or adjusted under 35 U.S.C. 154(b) by 356 days.

(21) Appl. No.: 18/575,994

(22) PCT Filed: Oct. 18, 2023

(86) PCT No.: PCT/KR2023/016103
§ 371 (c)(1),
(2) Date: Jan. 2, 2024

(87) PCT Pub. No.: WO2024/262708
PCT Pub. Date: Dec. 26, 2024

(65) Prior Publication Data
US 2025/0107109 A1 Mar. 27, 2025

(30) Foreign Application Priority Data
Jun. 22, 2023 (KR) ........................ 10-2023-0080681

(51) Int. Cl.
*H01L 23/00* (2006.01)
*H01L 25/00* (2006.01)
(Continued)

(52) U.S. Cl.
CPC ............ *H10B 80/00* (2023.02); *H10W 90/00* (2026.01); *H10W 80/312* (2026.01); *H10W 80/327* (2026.01); *H10W 90/792* (2026.01)

(58) Field of Classification Search
CPC ........ H10B 80/00; H10B 12/30; H10B 12/00; H10B 12/50; H10B 12/482; H10B 12/09;
(Continued)

(56) References Cited

U.S. PATENT DOCUMENTS 10,923,450 B2 * 2/2021 Fastow .................. G11C 5/025
11,650,932 B2 5/2023 Balakrishnan et al.
(Continued)

FOREIGN PATENT DOCUMENTS

KR 10-2019-0096885 8/2019
KR 10-2020-0037894 4/2020
(Continued)

OTHER PUBLICATIONS

Office Action dated Jun. 26, 2024 corresponding to Korean Application No. 10-2023-0080681, 8 pages.
(Continued)

*Primary Examiner* — Nikolay K Yushin

(57) ABSTRACT

Disclosed are a memory device and a manufacturing method thereof. The disclosed memory device may include a first substrate structure including a plurality of sense amplifiers (S/A) and a peripheral circuit unit, a second substrate structure bonded to a first surface side of the first substrate structure and including a first cell block including a plurality of first memory cells and a plurality of first bit lines, and a third substrate structure bonded to a second surface side of the first substrate structure and including a second cell block including a plurality of second memory cells and a plurality of second bit lines, wherein each of the plurality of first bit lines and each of the plurality of second bit lines may be commonly connected to each of the plurality of sense amplifiers (S/A).

20 Claims, 11 Drawing Sheets

(51) Int. Cl.

| | |
|---|---|
| ***H01L 25/065*** | (2023.01) |
| ***H01L 25/18*** | (2023.01) |
| ***H10B 80/00*** | (2023.01) |
| ***H10W 90/00*** | (2026.01) |
| *H10W 80/00* | (2026.01) |

(58) Field of Classification Search
CPC .......................... H10B 12/092; H10W 80/312; H10W 80/327; H10W 90/00; H10W 90/79; H10W 90/792; G11C 11/4097; G11C 11/0416; G11C 11/4091; G11C 11/5621
See application file for complete search history.

(56) References Cited

U.S. PATENT DOCUMENTS

| | | | | |
|---|---|---|---|---|
| 2020/0266182 | A1 | 8/2020 | Nishikawa et al. | |
| 2020/0395328 | A1* | 12/2020 | Fastow | G11C 5/025 |

FOREIGN PATENT DOCUMENTS

| | | |
|---|---|---|
| KR | 10-2020-0133597 | 11/2020 |
| KR | 10-2022-0002468 | 1/2022 |
| KR | 10-2022-0002570 | 1/2022 |
| KR | 10-2022-0049701 | 4/2022 |
| KR | 10-2022-0049866 | 4/2022 |
| KR | 10-2022-0133364 | 10/2022 |
| KR | 10-2022-0166604 | 12/2022 |
| KR | 10-2023-0103773 | 7/2023 |

OTHER PUBLICATIONS

International Search Report mailed Mar. 18, 2024 for PCT/KR2023/016103, 5 pages.

Office Action dated Nov. 21, 2024 corresponding to Korean Application No. 10-2023-0080681, 10 pages.

* cited by examiner

FIG. 1

1000
CELL BLOCK
S20
100
20
10
30
S/A
S10
50
CELL BLOCK
2000
S30
200

< Comparative example >

A12

C12/C22

BL

BL

100/220

BL

BL

MEMORY DEVICE AND MANUFACTURING METHOD THEREOF

This application claims the priority of Korean Patent Application No. 10-2023-0080681, filed on Jun. 22, 2023 in the KIPO (Korean Intellectual Property Office), the disclosure of which is incorporated herein entirely by reference. Further, this application is the National Stage application of International Application No. PCT/KR2023/016103, filed on Oct. 18, 2023, which designates the United States and was published in Korean. Each of these applications is hereby incorporated by reference in their entirety into the present application.

TECHNICAL FIELD

The present invention relates to a semiconductor device/electronic device and a manufacturing method thereof, and more particularly, to a memory device and a manufacturing method thereof.

BACKGROUND ART

There is a continuous need to increase the performance of semiconductor devices and the degree of integration of semiconductor devices. Arranging unit cells of semiconductor devices two-dimensionally, that is, in a planar manner, is reaching its limit in increasing the degree of integration of semiconductor devices. Accordingly, attempts are being made to develop technologies which greatly increase the degree of integration of semiconductor devices by three-dimensionally integrating the unit cells of the semiconductor devices. In this regard, attempts to increase the integration of memory devices such as NAND devices or DRAM devices are being attempted in various forms. In addition, research and development are continuously being conducted to improve the performance and operating characteristics of memory devices.

In a method for operating a memory device, data reading (sensing) may be performed by comparing the voltage of a bit line in a cell block to be operated with the voltage of a comparison target bit line (comparison bit line) in another cell block. However, there is a problem that RC delay difference and capacitance difference occur due to the difference in wiring length between the bit line and the comparison target bit line. As memory devices become more highly integrated, the problems caused by the above-described wiring length difference may increase. In addition, the structure of existing memory devices has the disadvantage that it is difficult to arrange the sense amplifier (S/A), the sub word line driver (SWD), the peripheral circuit, etc.

DISCLOSURE OF THE INVENTION

Technical Problem

The technological object to be achieved by the present invention is to provide a memory device which may suppress/prevent RC delay differences and capacitance differences by matching wiring lengths of a bit line and a comparison bit line to the same (or substantially the same).

In addition, the technological object to be achieved by the present invention is to provide a memory device which may reduce the difficulties of placement of a sense amplifier (S/A), a peripheral circuit, and a sub word line driver (SWD).

In addition, the technological object to be achieved by the present invention is to provide a memory device which may significantly improve an integration degree three-dimensionally, secure excellent performance, and facilitate manufacturing process.

In addition, the technological object to be achieved by the present invention is to provide a manufacturing method of the above-described memory device.

The objects to be achieved by the present invention is not limited to the objects mentioned above, and other objects not mentioned will be understood by those skilled in the art from the description below.

Technical Solution

According to one embodiment of the present invention, there is provided a memory device comprising: a first substrate structure including a plurality of sense amplifiers (S/A) and a peripheral circuit unit; a second substrate structure bonded to a first surface side of the first substrate structure and including a first cell block including a plurality of first memory cells and a plurality of first bit lines; and a third substrate structure bonded to a second surface side of the first substrate structure and including a second cell block including a plurality of second memory cells and a plurality of second bit lines, and wherein each of the plurality of first bit lines and each of the plurality of second bit lines are commonly connected to each of the plurality of sense amplifiers (S/A).

At least some of the plurality of sense amplifiers (S/A) may be arranged to be adjacent to each other in a first direction, and at least some of the plurality of first bit lines and at least some of the plurality of second bit lines corresponding thereto may be arranged alternately along the first direction when observed from above.

At least some of the plurality of second memory cells may be arranged to be shifted by a given distance in the first direction or in a reverse direction thereof with respect to at least some of the plurality of first memory cells corresponding thereto.

At least some of the plurality of sense amplifiers (S/A) may be arranged to be adjacent to each other in a first direction, and at least some of the plurality of first bit lines and at least some of the plurality of second bit lines corresponding thereto may be arranged to be spaced apart from each other or to be adjacent to each other in a second direction perpendicular to the first direction when observed from above.

At least some of the plurality of second memory cells may be arranged to be shifted by a given distance in the second direction or in a reverse direction thereof with respect to at least some of the plurality of first memory cells corresponding thereto.

Each of at least some of the plurality of first bit lines and each of at least some of the plurality of second bit lines corresponding thereto may be arranged so that their positions coincide with each other when observed from above.

Each of at least some of the plurality of first memory cells and each of at least some of the plurality of second memory cells corresponding thereto may be arranged so that their positions coincide with each other when observed from above.

The first bit line and the second bit line commonly connected to one sense amplifier (S/A) may have the same length.

A length of a connection wiring from the first bit line to the sense amplifier (S/A) may be the same as a length of a connection wiring from the second bit line to the sense amplifier (S/A).

The first substrate structure may include a plurality of first contact pads arranged on the first surface side and a plurality of second contact pads arranged on the second surface side, and the plurality of first bit lines may be respectively in contact with the plurality of first contact pads, and the plurality of second bit lines may be respectively in contact with the plurality of second contact pads.

The memory device may be a three-dimensional stacked memory device.

The memory device may be a three-dimensional stacked DRAM device.

According to another embodiment of the present invention, there is provided a manufacturing method of a memory device comprising: preparing a first substrate structure including a plurality of sense amplifiers (S/A) and a peripheral circuit unit; bonding a second substrate structure including a first cell block including a plurality of first memory cells and a plurality of first bit lines to a first surface side of the first substrate structure; and bonding a third substrate structure including a second cell block including a plurality of second memory cells and a plurality of second bit lines to a second surface side of the first substrate structure, and wherein each of the plurality of first bit lines and each of the plurality of second bit lines are commonly connected to each of the plurality of sense amplifiers (S/A).

At least some of the plurality of sense amplifiers (S/A) may be arranged to be adjacent to each other in a first direction, and at least some of the plurality of first bit lines and at least some of the plurality of second bit lines corresponding thereto may be arranged alternately along the first direction when observed from above.

At least some of the plurality of sense amplifiers (S/A) may be arranged adjacent to each other in a first direction, and at least some of the plurality of first bit lines and at least some of the plurality of second bit lines corresponding thereto may be arranged to be spaced apart from each other or to be adjacent to each other in a second direction perpendicular to the first direction when observed from above.

Each of at least some of the plurality of first bit lines and each of at least some of the plurality of second bit lines corresponding thereto may be arranged so that their positions coincide with each other when observed from above.

The first substrate structure may include a plurality of first contact pads arranged on the first surface side and a plurality of second contact pads arranged on the second surface side, the plurality of first bit lines may be respectively in contact with the plurality of first contact pads, and the plurality of second bit lines may be respectively in contact with the plurality of second contact pads.

The first substrate structure may be a first wafer structure, the second substrate structure may be a second wafer structure, and the third substrate structure may be a third wafer structure.

The memory device may be a three-dimensional stacked memory device.

Advantageous Effects

According to embodiments of the present invention, it is possible to implement a memory device capable of suppressing/preventing RC delay differences and capacitance differences by matching wiring lengths of a bit line and a comparison bit line to the same (or substantially the same). Furthermore, according to embodiments of the present invention, it is possible to implement a memory device which may reduce the difficulties in placing a sense amplifier (S/A), a peripheral circuit, a sub word line driver (SWD), etc. In addition, according to embodiments of the present invention, it is possible to implement a memory device which may significantly improve an integration degree three-dimensionally, secure excellent performance, and facilitate the manufacturing process. According to one example, the memory device may be a three-dimensional stacked memory device. As a specific example, the memory device may be a three-dimensional stacked DRAM device or may be configured to include it.

However, the effects of the present invention are not limited to the above effects and may be expanded in various ways without departing from the technological spirit and scope of the present invention.

BRIEF DESCRIPTION OF THE DRAWINGS

FIG. 1 is a perspective view schematically illustrating a memory device according to an embodiment of the present invention.

BEST MODE FOR CARRYING OUT THE INVENTION

Figure 2:
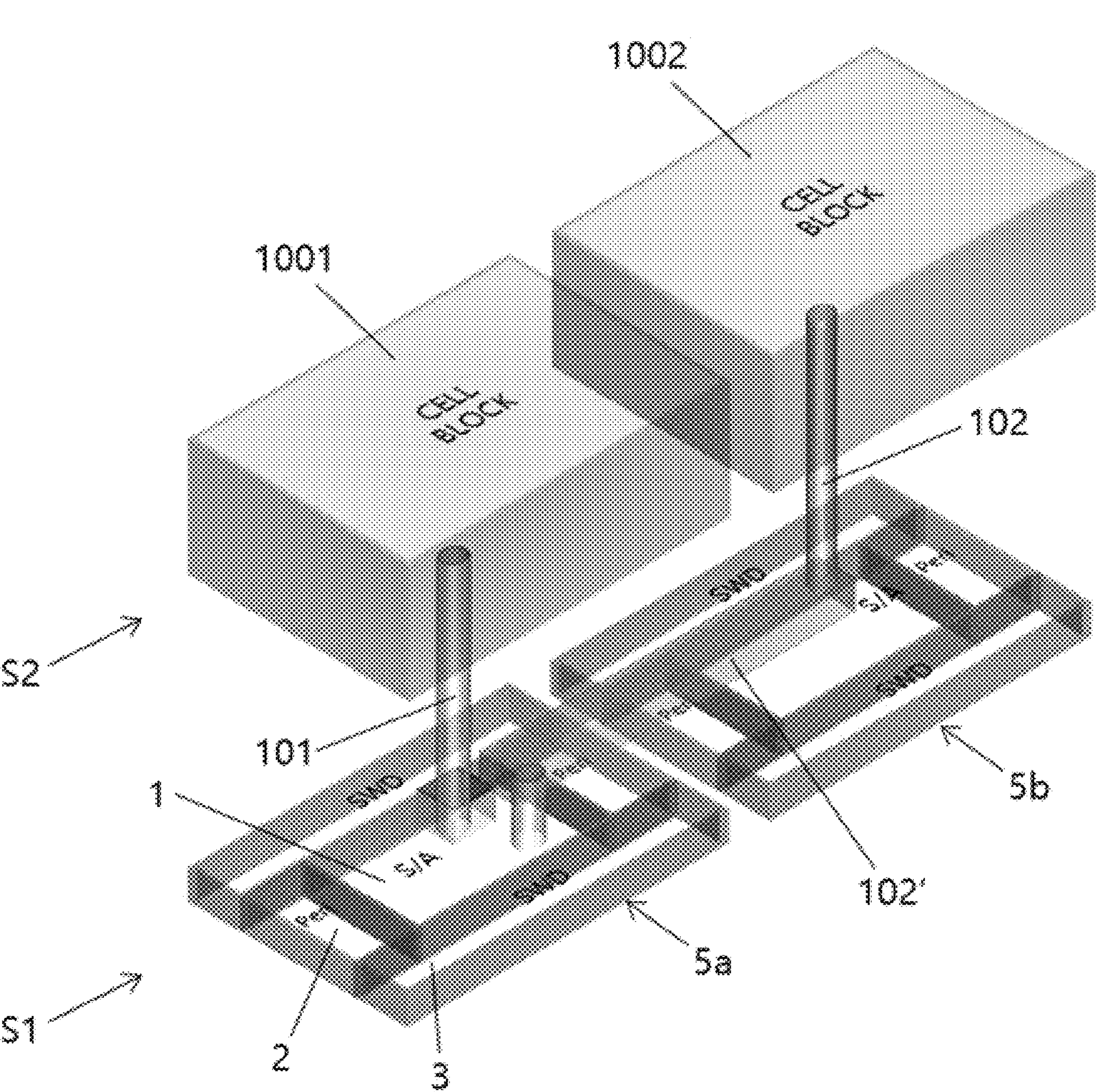
FIG. 2 is a perspective view for explaining a memory device according to a comparative example.

Hereinafter, embodiments of the present invention will be described in detail with reference to the accompanying drawings.

The embodiments of the present invention to be described below are provided to more clearly explain the present invention to those skilled in the art, and the scope of the present invention is not limited by the following embodiments, and the embodiments may be modified in many different forms.

The terms used in this specification are used to describe specific embodiments and are not intended to limit the present invention. The terms indicating a singular form used herein may include plural forms unless the context clearly indicates otherwise. Also, as used herein, the terms, "comprise" and/or "comprising" specify the presence of the stated shape, step, number, operation, member, element, and/or group thereof and does not exclude the presence or addition of one or more other shapes, steps, numbers, operations, elements, elements and/or groups thereof. In addition, the term, "connection" used in this specification means not only a direct connection of certain members, but also a concept including an indirect connection in which other members are interposed between the members.

In addition, in the description of this specification, descriptions such as "first" and "second", "upper or top", and "lower or bottom" are intended to distinguish members, and they are not used to limit the members themselves, or to mean a specific order, but rather they are used to convey a relative positional relationship and does not limit the specific cases where other configuration members are in direct contact with the described members or another member is introduced into the interface between them. The same interpretation may be applied to other expressions which describe relationships between components.

In addition, in the present specification, when a member is said to be located "on" another member, this arrangement includes not only a case in which a member is in contact with another member, but also a case where another member exists between the two members. As used herein, the term, "and/or" includes any one and all combinations of one or more of the listed items. In addition, the terms of degree such as "about" and "substantially" used in the present specification are used as a range of values or degrees, or as a meaning close thereto, taking into account inherent manufacturing and substance tolerances, and exact or absolute figures provided to aid in the understanding of this application are used to prevent the infringers from unfairly exploiting the stated disclosure.

Hereinafter, embodiments of the present invention will be described in detail with reference to the accompanying drawings. A size or a thickness of areas or parts shown in the accompanying drawings may be slightly exaggerated for clarity of the specification and convenience of description. The same reference numbers indicate the same configuring elements throughout the detailed description.

Figure 1:
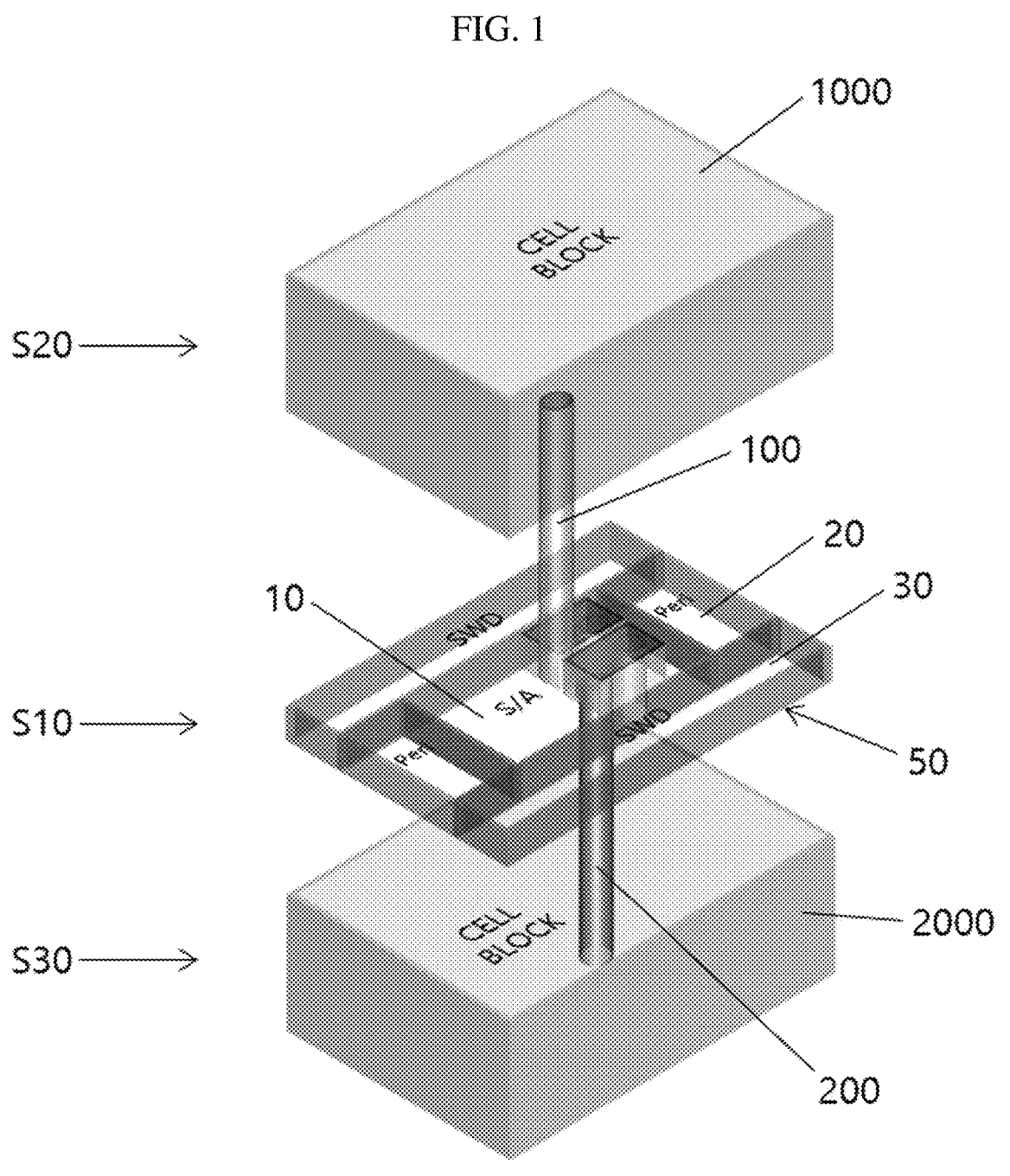

FIG. 1 is a perspective view schematically illustrating a memory device according to an embodiment of the present invention.

Referring to FIG. 1, a memory device according to an embodiment of the present invention may include a first substrate structure S10. The first substrate structure S10 may be referred to as an 'intermediate circuit substrate' or a 'peripheral circuit substrate.' The first substrate structure S10 may include a circuit block 50. The circuit block 50 may include, for example, a sensing circuit unit 10, a peripheral circuit unit 20, and a sub word line driver (SWD) 30. Here, the sensing circuit unit 10 may include a plurality of sense amplifiers (S/A). The SWD 30 may be disposed on both sides of the sensing circuit 10 in a first direction, and the peripheral circuit 20 may be disposed on both sides of the sensing circuit 10 in a second direction. However, the specific configuration of the circuit block 50 may vary. The first substrate structure S10 may include a plurality of circuit blocks 50. The first substrate structure S10 may be manufactured from a first wafer.

The memory device may include a second substrate structure S20. The second substrate structure S20 may include a first cell block 1000. The first cell block 1000 may include a plurality of first memory cells and a plurality of first bit lines 100. For convenience, only one first bit line 100 is shown in FIG. 1, but a plurality of first bit lines 100 may be included in the first cell block 1000. The second substrate structure S20 may include a plurality of first cell blocks 1000. The second substrate structure S20 may be manufactured from a second wafer. The second substrate structure S20 may be bonded to a first surface side of the first substrate structure S10. For example, the second substrate structure S20 may be bonded to an upper surface side of the first substrate structure S10.

The memory device may include a third substrate structure S30. The third substrate structure S30 may include a second cell block 2000. The second cell block 2000 may include a plurality of second memory cells and a plurality of second bit lines 200. For convenience, only one second bit line 200 is shown in FIG. 1, but a plurality of second bit lines 200 may be included in the second cell block 2000. The third substrate structure S30 may include a plurality of second cell blocks 2000. The third substrate structure S30 may be manufactured from a third wafer. The third substrate structure S30 may be bonded to a second surface side of the first substrate structure S10. For example, the third substrate structure S30 may be bonded to a lower surface side of the first substrate structure S10. A memory device according to an embodiment may be manufactured through bonding of three wafer structures.

According to an embodiment of the present invention, each of the plurality of first bit lines 100 and each of the plurality of second bit lines 200 may be commonly connected to each of the plurality of sense amplifiers (S/A) described above. One first bit line 100 and one second bit line 200 may be connected to one sense amplifier (S/A). One of the first bit line 100 and the second bit line 200 corresponding thereto may be a bit line to be sensed, and the other may be a comparison target bit line (a comparison bit line, that is, a bit line bar) for voltage comparison.

In an embodiment of the present invention, three substrate structures S10, S20, and S30 may be arranged in a vertical direction, the second substrate structure S20 and the third substrate structure S30 having the cell blocks above and below the first substrate structure S10 including peripheral circuits may be placed, respectively, and the first bit line 100 and the second bit line 200 may be connected to the first substrate structure S10. In this case, it may be easy to match the wiring length of the bit line to be sensed and the bit line to be compared to the same (or substantially the same), and the RC delay difference and capacitance difference may be suppressed/prevented. In addition, the difficulty in placing sense amplifiers (S/A), peripheral circuits, and sub word line drivers (SWD) may be reduced.

The first bit line 100 and the second bit line 200 commonly connected to one sense amplifier (S/A) may have the same length or substantially the same length. Furthermore, according to another embodiment, the first substrate structure S10 may further include a plurality of first contact pads arranged on the first surface side and a plurality of second contact pads arranged on the second surface side. In this case, the plurality of first bit lines 100 may be respectively in contact with the plurality of first contact pads and the plurality of second bit lines 200 may be respectively in contact with the plurality of second contact pads. In addition, a plurality of first wiring portions may be further provided to connect the plurality of first contact pads to the plurality of sense amplifiers (S/A), and a plurality of second wiring portions may be further provided to connect the plurality of second contact pads to the plurality of sense amplifiers (S/A). That is, the first substrate structure S10 may further include the plurality of first wiring portions and the plurality of second wiring portions. According to an embodiment of the present invention, the length of a connection wiring from the first bit line 100 to the sense amplifier (S/A) may be the same or substantially the same as the length of a connection wiring from the second bit line 200 to the sense amplifier (S/A). Here, the first bit line 100 and the second bit line 200 are lines commonly connected to one sense amplifier (S/A). Therefore, it is possible to suppress/prevent the RC delay difference and capacitance difference due to the difference in length of the bit line wiring.

Furthermore, the second substrate structure S20 may further include a first auxiliary peripheral circuit (not shown), and the third substrate structure S30 may further include a second auxiliary peripheral circuit (not shown). The first and the second auxiliary peripheral circuits may be referred to as 'small peri'.

FIG. 2 is a perspective view for explaining a memory device according to a comparative example.

Referring to FIG. 2, the memory device according to the comparative example is composed of a first substrate structure S1 and a second substrate structure S2 bonded thereto. The memory device according to the comparative example may be manufactured through bonding two wafer structures.

The first substrate structure S1 may include a circuit block 5*a*. The circuit block 5*a* includes a sensing circuit unit 1, a peripheral circuit unit 2, and a sub word line driver (SWD) 3. The sensing circuit unit 1 includes a plurality of sense amplifiers (S/A). The second substrate structure S2 may include a first cell block 1001 and a second cell block 1002. The first cell block 1001 may include a plurality of first memory cells and a plurality of first bit lines 101. For convenience, only one first bit line 101 is shown in FIG. 2. The second cell block 1002 may include a plurality of second memory cells and a plurality of second bit lines 102. For convenience, only one second bit line 102 is shown in FIG. 2. The second substrate structure S2 may be bonded to an upper surface side of the first substrate structure S1.

One first bit line 101 and one second bit line 102 may be connected to one sense amplifier (S/A) of the circuit block 5*a*. One of the first bit line 101 and the corresponding second bit line 102 may be a bit line to be sensed, and the other may be a comparison target bit line (a comparison bit line, that is, a bit line bar) for voltage comparison. In the case of the comparative example, an additional wiring 102' may be needed to connect the second bit line 102 to the sense amplifier (S/A). A combination of the second bit line 102 and the additional wiring 102' may be regarded as one 'second bit line' or 'second bit line wiring'. As a result, the first bit line 101 and the second bit line wiring 102+102' may have a significant wiring length difference. Therefore, RC delay difference and capacitance difference may occur due to this difference in wiring length, which may adversely affect the operating characteristics and performance of the memory device.

Furthermore, the first substrate structure S1 further includes another circuit block 5*b* disposed on the same plane as the circuit block 5*a*. Two separate cell blocks (not shown) other than the first cell block 1001 and the second cell block 1002 are connected to the circuit block 5*b*. As in the comparative example above, when a memory device is configured by bonding two wafer structures, the difficulty in placing a sense amplifier (S/A), a peripheral circuit, a sub word line driver (SWD), etc. may increase. This problem may become more severe as memory devices become more highly integrated.

However, according to an embodiment of the present invention, as previously described with reference to FIG. 1, three substrate structures S10, S20, S30 are arranged in a vertical direction, and the second substrate structure S20 and the third substrate structure S30 including cell blocks, respectively may be arranged above and below the first substrate structure S10 including peripheral circuits, and the first bit line 100 and the second bit line 200 may be connected to the first substrate structure S10. In this case, it may be easy to match the wiring length of the bit line to be sensed and the bit line to be compared to the same (or substantially the same), and the RC delay difference and capacitance difference may be suppressed/prevented. In addition, the difficulty in placing a sense amplifier (S/A), a peripheral circuit, and a sub word line driver (SWD) may be reduced.

Figure 3:
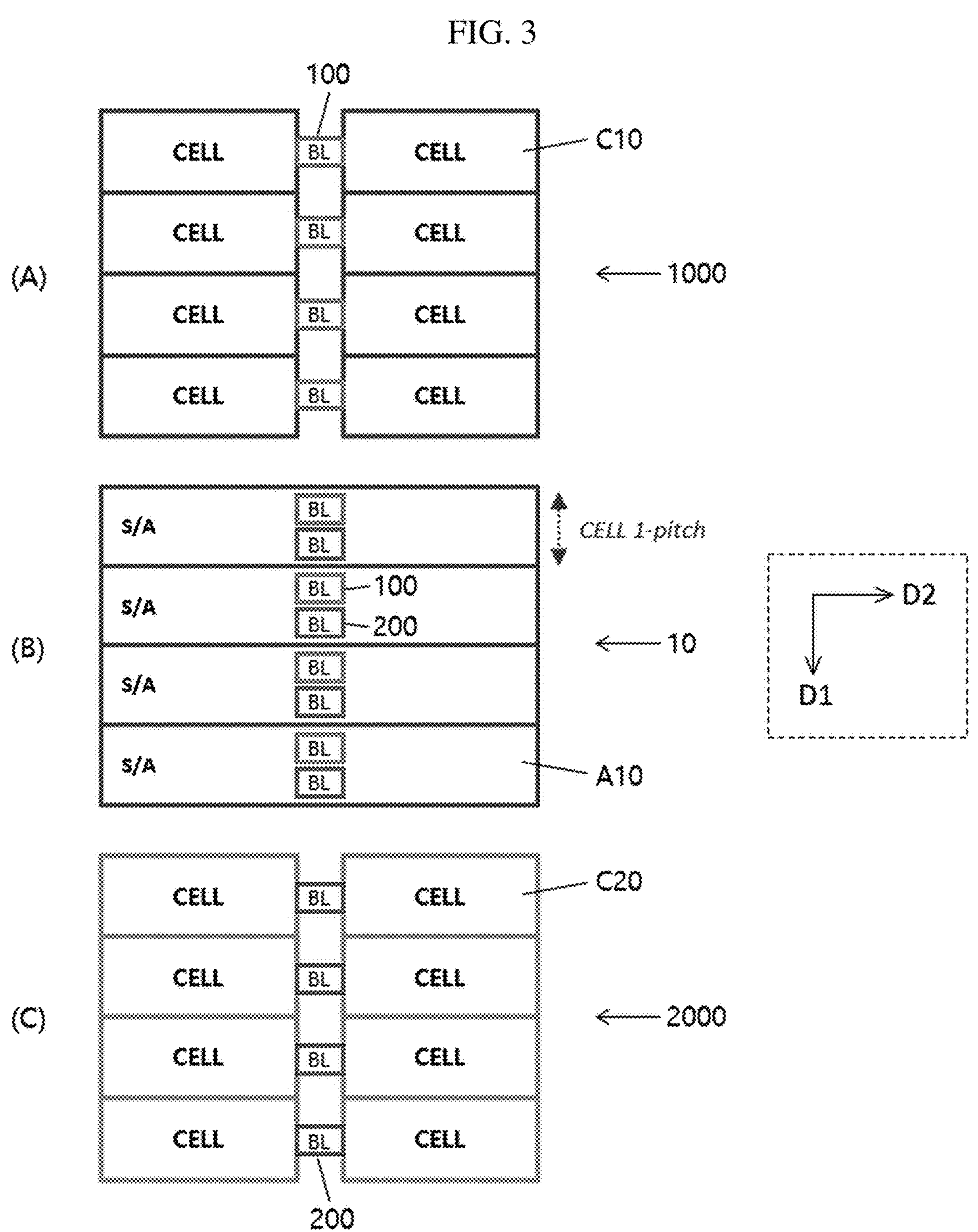
FIG. 3 is a diagram for explaining a memory device according to an embodiment of the present invention.

FIG. 3 is a diagram for explaining a memory device according to an embodiment of the present invention. The drawing (A) of FIG. 3 is a plan view illustrating a planar structure which the first cell block 1000 of FIG. 1 may have, the drawing (B) is a plan view illustrating a planar structure which the sensing circuit unit 10 of FIG. 1 may have, and the drawing (C) of is a plan view illustrating a planar structure which the second cell block 2000 of FIG. 1 may have.

Figure 4:
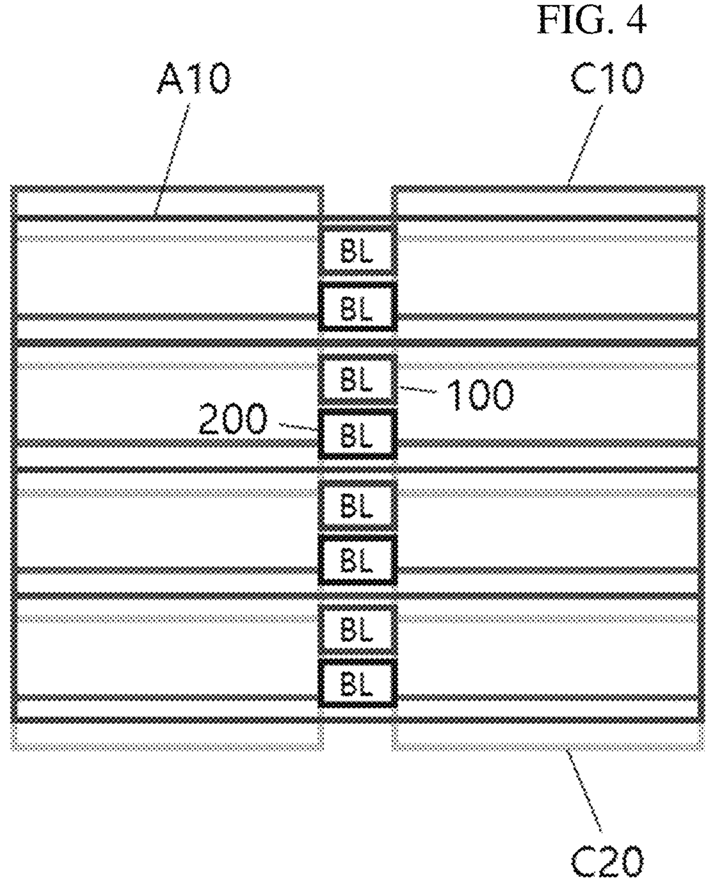
FIG. 4 is a plan view showing a configuration in which a first cell block, a sensing circuit unit, and a second cell block of FIG. 3 are bonded.
Figure 4:
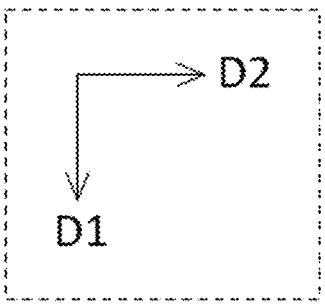

FIG. 4 is a plan view showing a configuration in which the first cell block 1000, the sensing circuit unit 10, and the second cell block 2000 of FIG. 3 are bonded.

Referring to FIGS. 3 and 4, the first cell block 1000 may include a plurality of first memory cells C10 and a plurality of first bit lines 100. The second cell block 2000 may include a plurality of second memory cells C20 and a plurality of second bit lines 200. At least some of the plurality of first bit lines 100 may be arranged to be spaced apart from each other in a first direction D1, and the first memory cells C10 may be disposed on both sides of the first bit line 100. At least some of the plurality of second bit lines 200 may be arranged to be spaced apart from each other in the first direction D1, and the second memory cells C20 may be disposed on both sides of the second bit line 200.

At least some of the plurality of sense amplifiers (S/A) A10 may be arranged adjacent to each other in the first direction D1. At least some of the plurality of first bit lines 100 and at least some of the plurality of second bit lines 200 corresponding thereto may be alternately arranged along the first direction D1 when observed from above. The first bit line 100 and the corresponding second bit line 200 may be connected to one sense amplifier (S/A) A10.

As shown in FIG. 4, at least some of the plurality of second memory cells C20 may be shifted by a given distance in the first direction D1 or in a reverse direction thereof with respect to at least some of the first memory cells C10 corresponding thereto. In addition, at least some of the plurality of first memory cells C10 may be shifted by a given distance in the first direction D1 or in the reverse direction thereof with respect to at least some of the plurality of sense amplifiers (S/A) A10 corresponding thereto, and at least some of the plurality of second memory cells C20 may be may be shifted by a given distance in the first direction D1 or in the reverse direction thereof with respect to at least some of the plurality of sense amplifiers (S/A) A10 corresponding thereto. At least some of the plurality of first memory cells C10 and at least some of the plurality of second memory cells C20 may be shifted in opposite directions with respect to at least some of the plurality of sense amplifiers (S/A) A10.

In FIG. 3 and FIG. 4, although the Z-axis cross sections of the first bit line 100 and the second bit line 200 are shown as squares, but the first bit line 100 and the second bit line 200 may be a circular cylindrical shape or a similar shape. This may be the same in FIGS. 5, 6, 8, 9, and 11, which will be described below.

Figure 5:
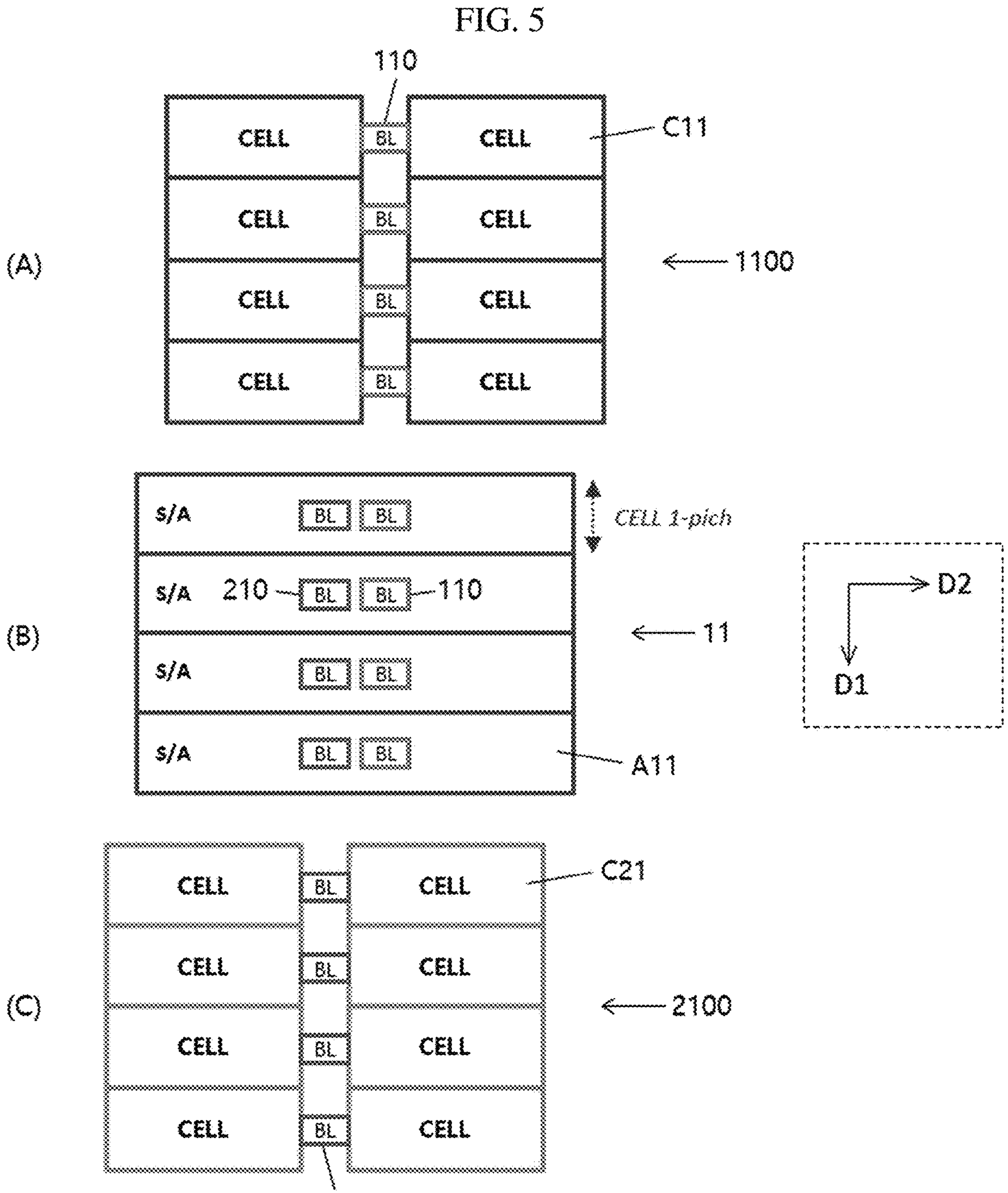
FIG. 5 is a diagram for explaining a memory device according to another embodiment of the present invention.

FIG. 5 is a diagram for explaining a memory device according to another embodiment of the present invention. The drawing (A) of FIG. 5 is a plan view illustrating a planar structure which the first cell block 1100 may have, the drawing (B) is a plan view illustrating the planar structure which the sensing circuit unit 11 may have, and the drawing (C) is a plan view illustrating a planar structure which the second cell block 2100 may have.

Figure 6:
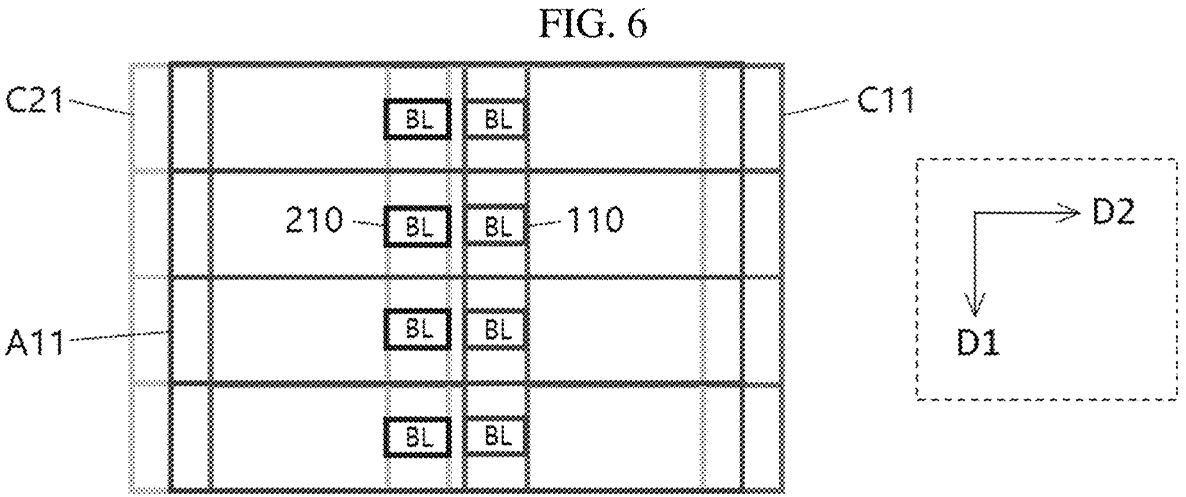
FIG. 6 is a plan view showing a configuration in which a first cell block, a sensing circuit unit, and a second cell block of FIG. 5 are bonded.

FIG. 6 is a plan view showing a configuration in which the first cell block 1100, the sensing circuit unit 11, and the second cell block 2100 of FIG. 5 are bonded.

Referring to FIGS. 5 and 6, the first cell block 1100 may include a plurality of first memory cells C11 and a plurality of first bit lines 110. The second cell block 2100 may include a plurality of second memory cells C21 and a plurality of second bit lines 210. At least some of the plurality of first bit lines 110 may be arranged to be spaced apart from each other in a first direction D1, and the first memory cells C11 may be disposed on both sides of the first bit line 110. At least some of the plurality of second bit lines 210 may be arranged to be spaced apart from each other in the first direction D1, and the second memory cells C21 may be disposed on both sides of the second bit line 210.

At least some of the plurality of sense amplifiers (S/A) A11 may be arranged adjacent to each other in the first direction D1. When observed from above, at least some of the plurality of first bit lines 110 and at least some of the plurality of second bit lines 210 corresponding thereto may be disposed to be spaced apart from each other or adjacent to each other in a second direction D2 perpendicular to the first direction D1. The first bit line 110 and the corresponding second bit line 210 may be connected to one sense amplifier (S/A) A11.

As shown in FIG. 6, at least some of the plurality of second memory cells C21 may be shifted by a given distance in the second direction D2 or a reverse direction thereof with respect to at least some of the first memory cells C11 corresponding thereto. In addition, at least some of the plurality of first memory cells C11 may be shifted by a given distance in the second direction D2 or the reverse direction thereof with respect to at least some of the plurality of sense amplifiers (S/A) A11 corresponding thereto, and at least some of the plurality of second memory cells C21 may be shifted by a given distance in the second direction D2 or the reverse direction thereof with respect to at least some of the plurality of sense amplifiers (S/A) A11 corresponding thereto. At least some of the plurality of first memory cells C11 and at least some of the plurality of second memory cells C21 may be shifted from each other in opposite directions with respect to at least some of the plurality of sense amplifiers (S/A) A11.

Figure 7:
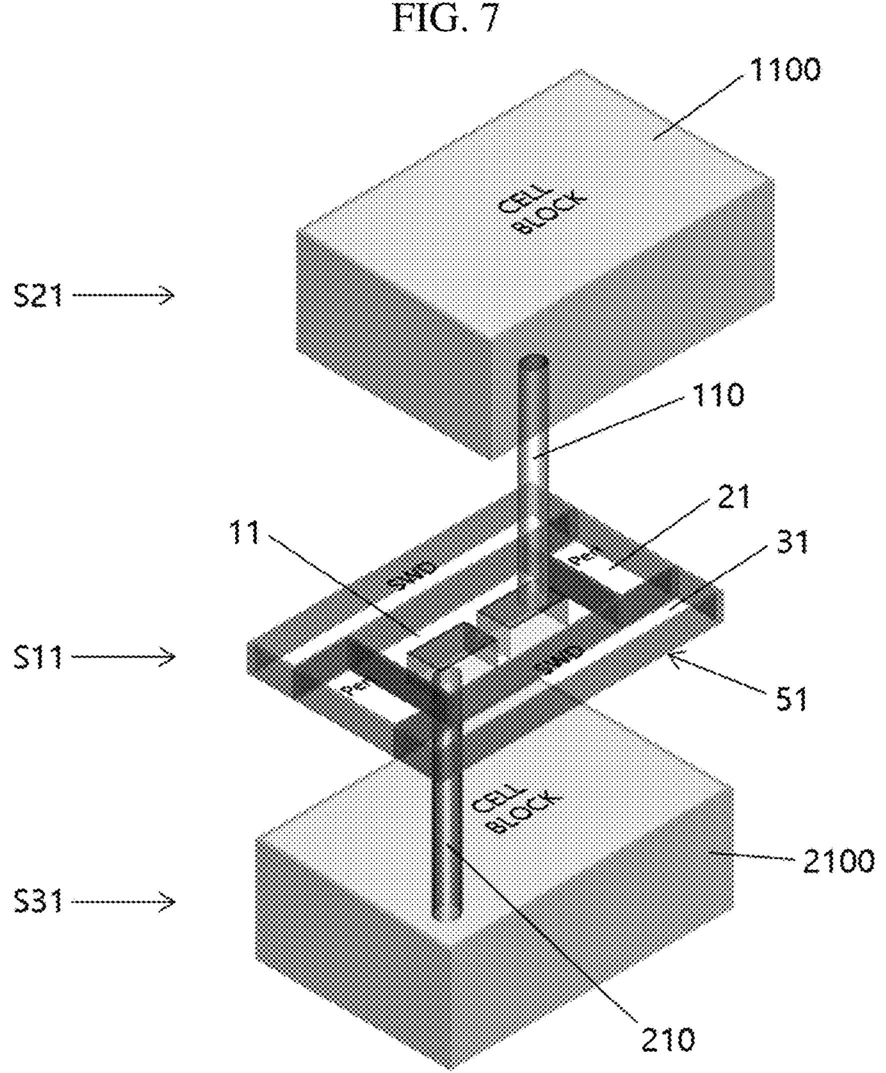
FIG. 7 is a perspective view schematically illustrating a memory device according to another embodiment of the present invention.

FIG. 7 is a perspective view schematically illustrating a memory device according to another embodiment of the present invention. The structure of the memory device in FIG. 7 may correspond to or be similar to the memory device described with reference to FIGS. 5 and 6.

Referring to FIG. 7, the memory device according to this embodiment may include a first substrate structure S11. The first substrate structure S11 may include a circuit block 51. The circuit block 51 may include, for example, a sensing circuit unit 11, a peripheral circuit unit 21, and a sub word line driver (SWD) 31. Here, the sensing circuit unit 11 may include a plurality of sense amplifiers (S/A). The first substrate structure S11 may include a plurality of circuit blocks 51. The first substrate structure S11 may be manufactured from a first wafer.

The memory device may include a second substrate structure S21. The second substrate structure S21 may include a first cell block 1100. The first cell block 1100 may include a plurality of first memory cells and a plurality of first bit lines 110. For convenience, only one first bit line 110 is shown in FIG. 7, but a plurality of first bit lines 110 may be included in the first cell block 1100. The second substrate structure S21 may include a plurality of first cell blocks 1100. The second substrate structure S21 may be manufactured from a second wafer. The second substrate structure S21 may be bonded to a first surface side of the first substrate structure S11. For example, the second substrate structure S21 may be bonded to an upper surface side of the first substrate structure S11.

The memory device may include a third substrate structure S31. The third substrate structure S31 may include a second cell block 2100. The second cell block 2100 may include a plurality of second memory cells and a plurality of second bit lines 210. For convenience, only one second bit line 210 is shown in FIG. 7, but a plurality of second bit lines 210 may be included in the second cell block 2100. The third substrate structure S31 may include a plurality of second cell blocks 2100. The third substrate structure S31 may be manufactured from a third wafer. The third substrate structure S31 may be bonded to a second surface side of the first substrate structure S11. For example, the third substrate structure S31 may be bonded to a lower surface side of the first substrate structure S11.

Each of the plurality of first bit lines 110 and each of the plurality of second bit lines 210 may be commonly connected to each of the plurality of sense amplifiers (S/A) described above. One first bit line 110 and one second bit line 210 may be connected to one sense amplifier (S/A). One of the first bit line 110 and the corresponding second bit line 210 may be a bit line to be sensed, and the other may be a bit line to be compared (a comparison bit line, that is, a bit line bar) for voltage comparison.

In this embodiment, at least some of the plurality of sense amplifiers (S/A) may be arranged adjacent to each other in a first direction (D1 in FIG. 5). When observed from above, the first bit line 110 and the corresponding second bit line 210 may be spaced apart from each other or disposed to be adjacent to each other with each other in a second direction (D2 in FIG. 5) perpendicular to the first direction (D1 in FIG. 5).

Furthermore, according to another embodiment, the first substrate structure S11 may further include a plurality of first contact pads arranged on the first surface side and a plurality of second contact pads arranged on the second surface side. In this case, the plurality of first bit lines 110 may be respectively in contact with the plurality of first contact pads, and the plurality of second bit lines 210 may be respectively in contact with the plurality of second contact pads. In addition, a plurality of first wiring portions may be further provided to connect the plurality of first contact pads to the plurality of sense amplifiers (S/A), and a plurality of second wiring portions may be further provided to connect a plurality of second contact pads to the plurality of sense amplifiers (S/A). That is, the first substrate structure S11 may further include the plurality of first wiring portions and the plurality of second wiring portions. According to an embodiment of the present invention, the length of the connection wiring from the first bit line 110 to the sense amplifier (S/A) may be the same or substantially the same as the length of the connection wiring from the second bit line 210 to the sense amplifier (S/A). Here, the first bit line 110 and the second bit line 210 are lines commonly connected to one sense amplifier (S/A). Therefore, it is possible to suppress/prevent the RC delay difference and capacitance difference due to the difference in length of the bit line wiring.

Figure 8:
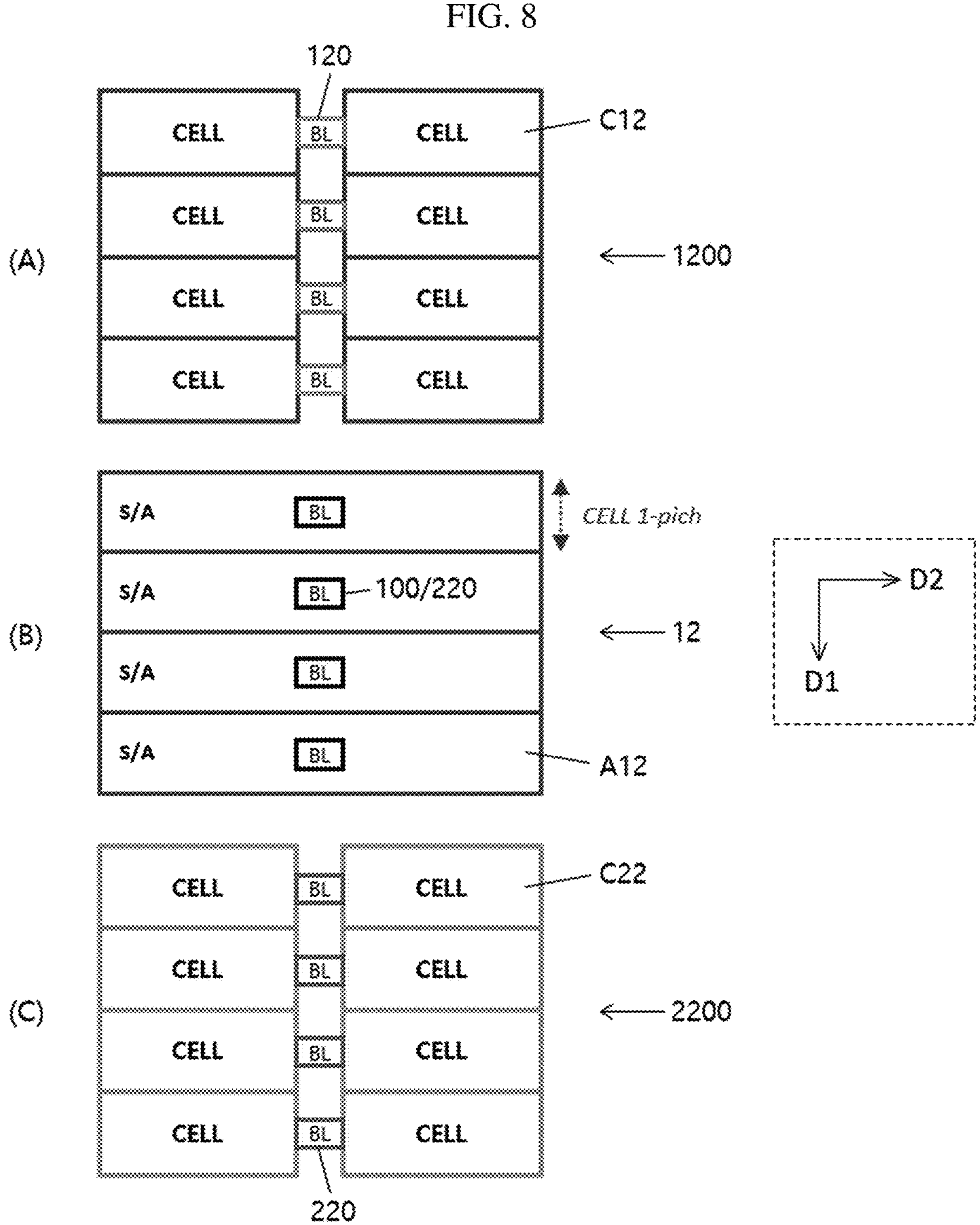
FIG. 8 is a diagram for explaining a memory device according to another embodiment of the present invention.

FIG. 8 is a diagram for explaining a memory device according to another embodiment of the present invention. The drawing (A) of FIG. 8 is a plan view illustrating a planar structure which the first cell block 1200 may have, the drawing (B) is a plan view illustrating a planar structure which the sensing circuit unit 12 may have, and the drawing (C) is a plan view illustrating a planar structure which the second cell block 2200 may have.

Figure 9:
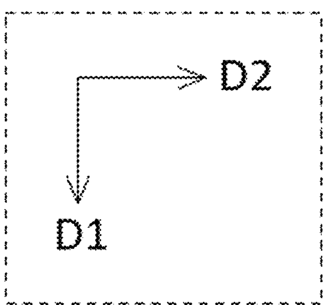
FIG. 9 is a plan view showing a configuration in which a first cell block, a sensing circuit unit, and a second cell block of FIG. 8 are bonded.

FIG. 9 is a plan view showing a configuration in which the first cell block 1200, the sensing circuit unit 12, and the second cell block 2200 of FIG. 8 are bonded.

Referring to FIGS. 8 and 9, the first cell block 1200 may include a plurality of first memory cells C12 and a plurality of first bit lines 120. The second cell block 2200 may include a plurality of second memory cells C22 and a plurality of second bit lines 220. At least some of the plurality of first bit lines 120 may be arranged to be spaced apart from each other in a first direction D1, and the first memory cells C12 may be disposed on both sides of the first bit line 120. At least some of the plurality of second bit lines 220 may be arranged to be spaced apart from each other in the first direction D1, and second memory cells C22 may be disposed on both sides of the second bit line 220.

At least some of the plurality of sense amplifiers (S/A) A12 may be arranged to be adjacent to each other in the first direction D1. Each of at least some of the plurality of first bit lines 120 and each of at least some of the plurality of second bit lines 220 corresponding thereto may be positioned so that their positions coincide with each other (or substantially match with each other) when observed from above. The first bit line 120 and the corresponding second bit line 220 may be connected to one sense amplifier (S/A) A12.

As shown in FIG. 9, each of at least some of the plurality of first memory cells C12 and each of at least some of the plurality of second memory cells C22 corresponding thereto may be arranged to coincide/match (or substantially coincide/match) with each other when observed from above. In addition, when observed from above, an each position of at least some of the plurality of first memory cells C12 and an each position of at least some of the plurality of second memory cells C22 corresponding thereto may be arranged to coincide/match (or substantially coincide/match) with an each position of at least some of the corresponding plurality of sense amplifiers (S/A) A12.

Figure 10:
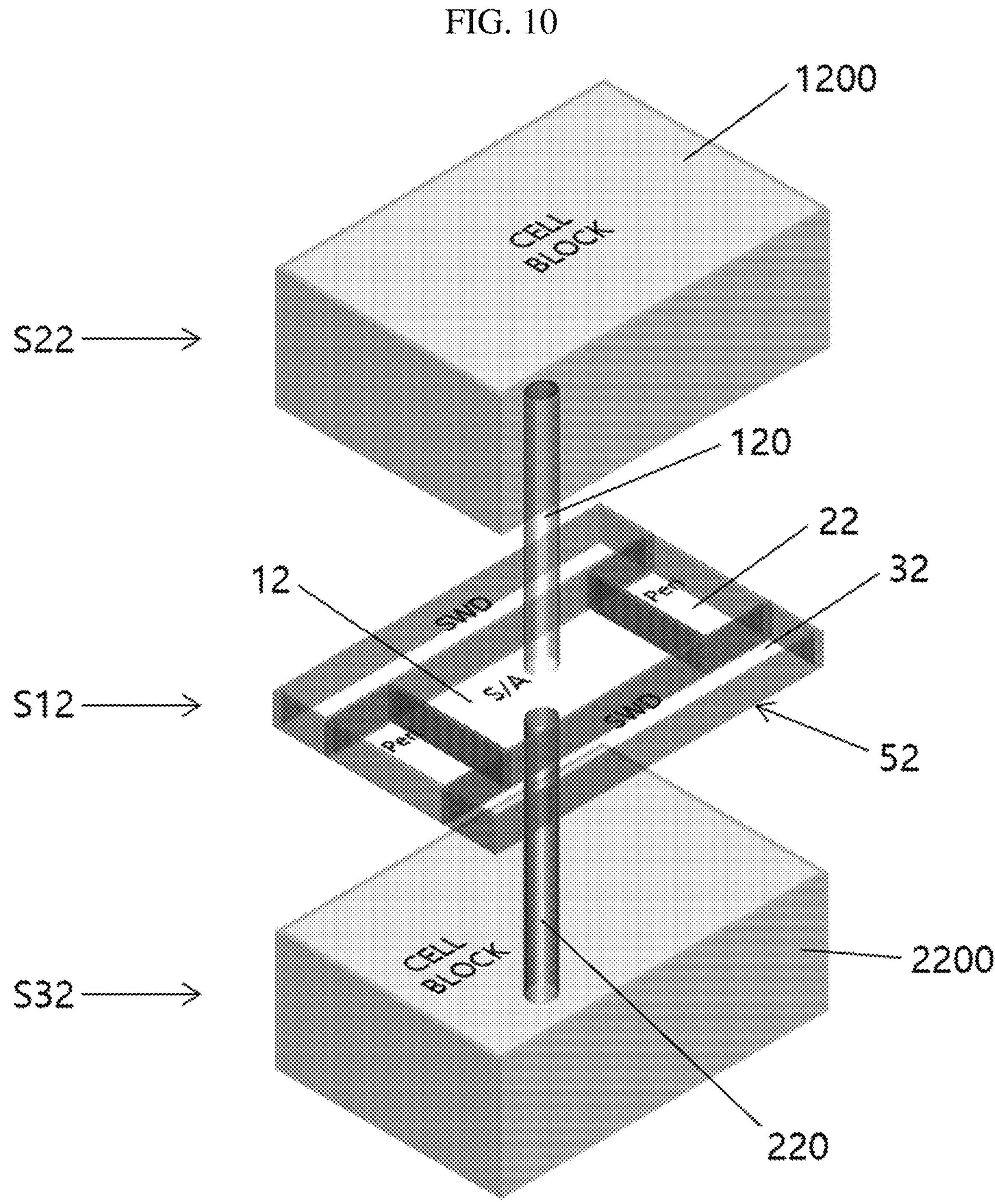
FIG. 10 is a perspective view schematically illustrating a memory device according to another embodiment of the present invention.

FIG. 10 is a perspective view schematically illustrating a memory device according to another embodiment of the present invention. The structure of the memory device of FIG. 10 may correspond to or be similar to the memory device described with reference to FIGS. 8 and 9.

Referring to FIG. 10, the memory device according to this embodiment may include a first substrate structure S12. The first substrate structure S12 may include a circuit block 52. The circuit block 52 may include, for example, a sensing circuit unit 12, a peripheral circuit unit 22, and a sub word line driver (SWD) 32. Here, the sensing circuit unit 12 may include a plurality of sense amplifiers (S/A). The first substrate structure S12 may include a plurality of circuit blocks 52. The first substrate structure S12 may be manufactured from a first wafer.

The memory device may include a second substrate structure S22. The second substrate structure S22 may include a first cell block 1200. The first cell block 1200 may include a plurality of first memory cells and a plurality of first bit lines 120. For convenience, only one first bit line 120 is shown in FIG. 10, but a plurality of first bit lines 120 may be included in the first cell block 1200. The second substrate structure S22 may include a plurality of first cell blocks 1200. The second substrate structure S22 may be manufactured from a second wafer. The second substrate structure S22 may be bonded to a first surface side of the first substrate structure S12. For example, the second substrate structure S22 may be bonded to an upper surface side of the first substrate structure S12.

The memory device may include a third substrate structure S32. The third substrate structure S32 may include a second cell block 2200. The second cell block 2200 may include a plurality of second memory cells and a plurality of second bit lines 220. For convenience, only one second bit line 220 is shown in FIG. 10, but a plurality of second bit lines 220 may be included in the second cell block 2200. The third substrate structure S32 may include a plurality of second cell blocks 2200. The third substrate structure S32 may be manufactured from a third wafer. The third substrate structure S32 may be bonded to a second surface side of the first substrate structure S12. For example, the third substrate structure S32 may be bonded to a lower surface side of the first substrate structure S12.

Each of the plurality of first bit lines 120 and each of the plurality of second bit lines 220 may be commonly connected to each of the plurality of sense amplifiers (S/A) described above. One first bit line 120 and one second bit line 220 may be connected to one sense amplifier (S/A). One of the first bit line 120 and the corresponding second bit line 220 may be a bit line to be sensed, and the other may be a bit line to be compared (a comparison bit line, that is, a bit line bar) for voltage comparison.

In this embodiment, at least some of the plurality of sense amplifiers (S/A) may be arranged to be adjacent to each other in a first direction (D1 in FIG. 8). Each of at least some of the plurality of first bit lines 120 and each of at least some of the plurality of second bit lines 220 corresponding thereto may be positioned so that their positions coincide with each other (or substantially coincide with each other) when observed from above.

Furthermore, according to another embodiment, the first substrate structure S12 may further include a plurality of first contact pads arranged on the first surface side and a plurality of second contact pads arranged on the second surface side. In this case, the plurality of first bit lines 120 may be respectively in contact with the plurality of first contact pads, and the plurality of second bit lines 220 may be respectively in contact with the plurality of second contact pads. In addition, a plurality of first wiring portions may be further provided to connect the plurality of first contact pads to the plurality of sense amplifiers (S/A), and a plurality of second wiring portions may be further provided to connect the plurality of second contact pads to the plurality of sense amplifiers (S/A). That is, the first substrate structure S12 may further include the plurality of first wiring portions and the plurality of second wiring portions. According to an embodiment of the present invention, the length of a connection wiring from the first bit line 120 to the sense amplifier (S/A) may be the same or substantially the same as the length of a connection wiring from the second bit line 220 to the sense amplifier (S/A).

A memory device according to an embodiment of the present invention may be a three-dimensional stacked memory device. In this case, according to an embodiment of the present invention, a memory device may be implemented which may greatly improve integration degree in a three-dimensional method, secure excellent performance, and facilitate the manufacturing process. The memory device may be, for example, a three-dimensional stacked DRAM device. The case where the memory device is a three-dimensional stacked DRAM device is illustrated in FIG. 11.

Figure 11:
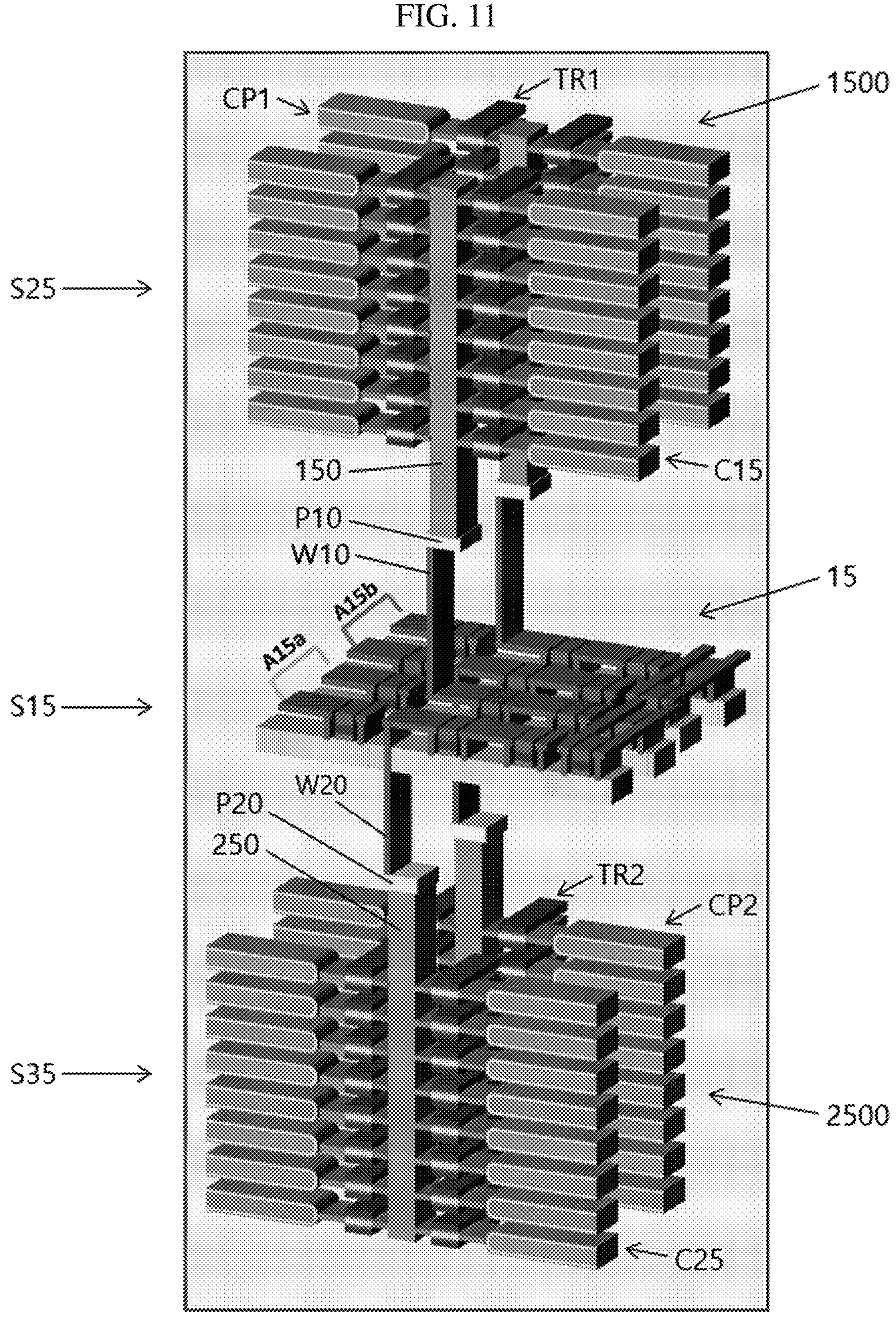
FIG. 11 is a perspective view for explaining a memory device according to another embodiment of the present invention.

FIG. 11 is a perspective view for explaining a memory device according to another embodiment of the present invention.

Referring to FIG. 11, the memory device according to this embodiment may include a first substrate structure S15. The first substrate structure S15 may include a circuit block, and the circuit block may include a sensing circuit unit 15. The sensing circuit unit 15 may include a plurality of sense amplifiers (S/A). Here, two sense amplifiers A15a and A15b are shown. The specific structure and size of the sense amplifiers A15a and A15b are exemplary and may vary. The first substrate structure S15 may be manufactured from a first wafer.

The memory device may include a second substrate structure S25. The second substrate structure S25 may include a first cell block 1500. The first cell block 1500 may include a plurality of first memory cells C15 and a plurality of first bit lines 150. For example, the first memory cell C15 may have a 1T-1C (one transistor one capacitor) structure. That is, the first memory cell C15 may include a transistor TR1 and a capacitor CP1 connected thereto. For example, the transistor TR1 may have a horizontal structure. For example, the capacitor CP1 may have a horizontal structure. A plurality of first memory cells C15 may be stacked in a vertical direction. The first bit line 150 may be arranged to be commonly connected to two or more first memory cells C15. The first bit line 150 may be a vertical wiring or may include a vertical wiring component.

The second substrate structure S25 may include a plurality of first cell blocks 1500. The second substrate structure S25 may be manufactured from a second wafer. The second substrate structure S25 may be bonded to a first surface side of the first substrate structure S15. For example, the second substrate structure S25 may be bonded to an upper surface side of the first substrate structure S15.

The memory device may include a third substrate structure S35. The third substrate structure S35 may include a second cell block 2500. The second cell block 2500 may include a plurality of second memory cells C25 and a plurality of second bit lines 250. For example, the second memory cell C25 may have a 1T-1C structure. That is, the second memory cell C25 may include a transistor TR2 and a capacitor CP2 connected thereto. For example, the transistor TR2 may have a horizontal structure. For example, the capacitor CP2 may have a horizontal structure. A plurality of second memory cells C25 may be stacked in a vertical direction. The second bit line 250 may be arranged to be commonly connected to two or more second memory cells C25. The second bit line 250 may be a vertical wiring or may include a vertical wiring component.

The third substrate structure S35 may include a plurality of second cell blocks 2500. The third substrate structure S35 may be manufactured from a third wafer. The third substrate structure S35 may be bonded to a second surface side of the first substrate structure S15. For example, the third substrate structure S35 may be bonded to a lower surface side of the first substrate structure S15.

Each of the plurality of first bit lines 150 and each of the plurality of second bit lines 250 may be commonly connected to each of the plurality of sense amplifiers A15a and A15b. One first bit line 150 and one second bit line 250 may be connected to one sense amplifier (A15a or A15b). One of the first bit line 150 and the corresponding second bit line 250 may be a bit line to be sensed, and the other may be a bit line to be compared (a comparison bit line, that is, a bit line bar) for voltage comparison.

According to one embodiment, the first substrate structure S15 may further include a plurality of first contact pads P10 arranged on the first surface side and a plurality of second contact pads P20 arranged on the second surface side. In this case, the plurality of first bit lines 150 may be respectively in contact with the plurality of first contact pads P10, and the plurality of second bit lines 210 may be respectively in contact with the plurality of second contact pads P20. The first contact pad P10 and the second contact pad P20 may have a larger width than the bit lines 150 and 250. Therefore, when using the first contact pad P10 and the second contact pad P20, a process margin may be easily secured.

In addition, according to one embodiment, a plurality of first wiring portions W10 may be further provided to connect the plurality of first contact pads P10 to the plurality of sense amplifiers A15a and A15b, and a plurality of second wiring portions W20 may be provided to connect the second contact pad P20 to the plurality of sense amplifiers A15a and A15b. That is, the first substrate structure S15 may further include a plurality of first wiring portions W10 and a plurality of second wiring portions W20. According to an embodiment, the length of the connection wiring from the first bit line 150 to the sense amplifier A15a or A15b may be the same or substantially the same as the length of the connection wiring from the second bit line 250 to the sense amplifier A15a or A15b. Therefore, it is possible to suppress/prevent the RC delay difference and capacitance difference due to the difference in length of the bit line wiring.

The overall structure and arrangement relationship of components in FIG. 11 may be similar to the embodiment described with reference to FIGS. 1, 3, and 4. At least a portion of the plurality of first contact pads P10, the plurality of second contact pads P20, the plurality of first wiring portions W10, and the plurality of second wiring portions W20 applied in FIG. 11 or the modified structure therefrom may be applied to the embodiments described with reference to FIGS. 1 and 3 to 10.

However, the specific structure of the 3D stacked DRAM device described with reference to FIG. 11 is exemplary and may be modified in various ways. Furthermore, the memory device according to the embodiment may be a 3D stacked memory device other than a 3D stacked DRAM device. Furthermore, the memory device according to the embodiment may be a memory device having a two-dimensional planar type structure rather than a three-dimensional stacked device. That is, the cell block may have a two-dimensional memory array structure.

Figure 12:
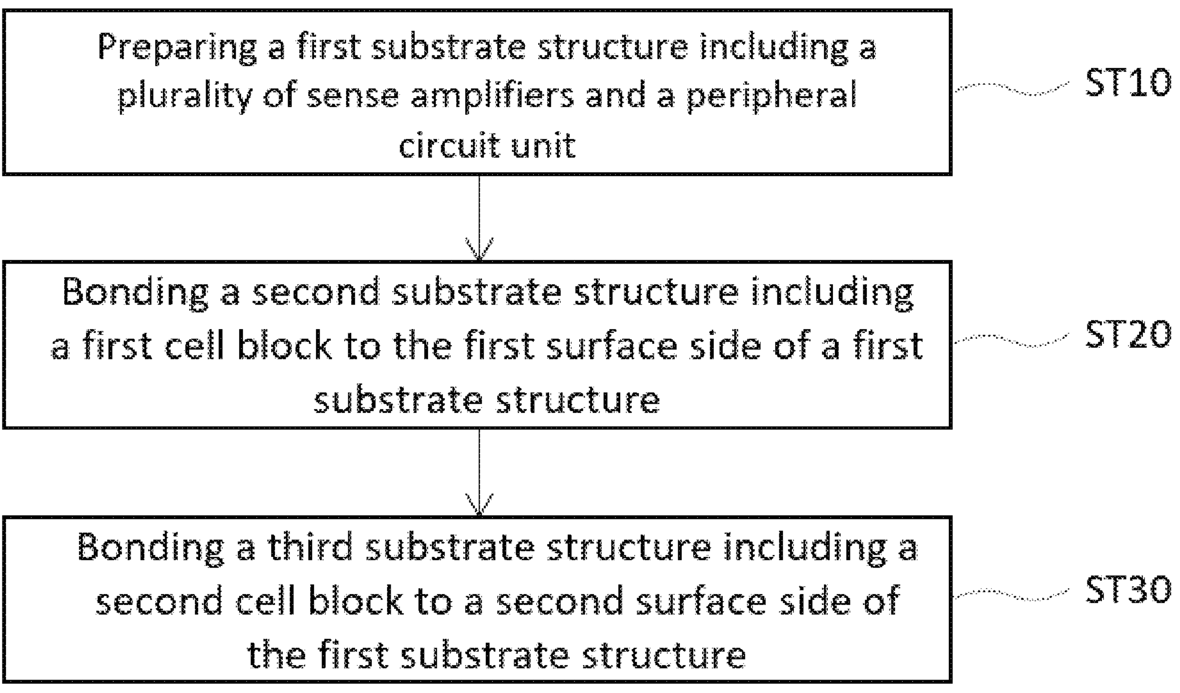
FIG. 12 is a flowchart for explaining a manufacturing method of a memory device according to an embodiment of the present invention.

FIG. 12 is a flowchart for explaining a manufacturing method of a memory device according to an embodiment of the present invention.

Referring to FIG. 12, the manufacturing method of a memory device according to an embodiment of the present invention may include a step ST10 for preparing a first substrate structure including a plurality of sense amplifiers (S/A) and a peripheral circuit unit, a step ST20 for bonding a second substrate structure including a first cell block including a plurality of first memory cells and a plurality of first bit lines to a first surface side of the first substrate structure, and a step ST30 for bonding a third substrate structure including a second cell block including a plurality of second memory cells and a plurality of second bit lines to a second surface side of the first substrate structure. Here, each of the plurality of first bit lines and each of the plurality of second bit lines may be commonly connected to each of the plurality of sense amplifiers (S/A).

In the above manufacturing method, the first substrate structure may be a first wafer structure, the second substrate structure may be a second wafer structure, and the third substrate structure may be a third wafer structure. Therefore, the process of bonding them may be a wafer bonding process. At least one of the first to third wafer structures may include a semiconductor wafer. The semiconductor wafer may include, for example, a bulk silicon substrate, a silicon-on-insulator (SOI) substrate, a germanium substrate, or a germanium-on-insulator (GOI) substrate, a silicon-germanium substrate, or a substrate formed through an epitaxial growth process. In addition, the substrate substances of the first to third wafer structures may vary.

According to one embodiment, at least some of the plurality of sense amplifiers (S/A) may be arranged to be adjacent to each other in a first direction, and at least some of the plurality of first bit lines and at least some of the plurality of first bit lines corresponding thereto may be alternately arranged along the first direction when observed from above.

According to one embodiment, at least some of the plurality of sense amplifiers (S/A) may be arranged to be adjacent to each other in a first direction, and at least some of the plurality of first bit lines and at least some of the plurality of first bit lines corresponding thereto may be spaced apart from each other or may be arranged to be adjacent to each other in in a second direction perpendicular to the first direction when observed from above.

According to one embodiment, each of at least some of the plurality of first bit lines and each of at least some of the plurality of second bit lines corresponding thereto may be arranged so that their positions coincide with each other when observed from above.

According to one embodiment, the first substrate structure may include a plurality of first contact pads arranged on the first surface side and a plurality of second contact pads arranged on the second surface side, and the plurality of first bit lines may be respectively in contact with the plurality of first contact pads, and the plurality of second bit lines may be respectively in contact with the plurality of second contact pads.

According to one embodiment, the memory device may be a three-dimensional stacked memory device. As a non-limiting example, the memory device may be a three-dimensional stacked DRAM device.

In addition, the structure and the characteristics of the memory device according to the embodiments described with reference to FIGS. 1 and 3 to 11 may be equally applied to the manufacturing method the memory device described with reference to FIG. 12.

According to the embodiments of the present invention described above, the RC delay difference and capacitance difference may be suppressed/prevented by adjusting the wiring lengths of the bit line and the comparison target bit line as the same (or substantially the same). Furthermore, according to embodiments of the present invention, a memory device which may reduce the difficulty of placing a sense amplifier (S/A), a peripheral circuit, a sub word line driver (SWD), etc. may be implemented. In addition, according to embodiments of the present invention, it is possible to implement a memory device which may significantly improve an integration degree three-dimensionally, secure excellent performance, and facilitate the manufacturing process. According to one example, the memory device may be a three-dimensional stacked memory device. As a specific example, the memory device may be a three-dimensional stacked DRAM device or may be configured to include it.

In this specification, the preferred embodiments of the present invention have been disclosed, and although specific terms have been used, they are only used in a general sense to easily explain the technological content of the present invention and to help understanding the present invention, and they are not used to limit the scope of the present invention. It is obvious to those having ordinary skill in the related art to which the present invention belong that other modifications based on the technological idea of the present invention may be implemented in addition to the embodiments disclosed herein. It will be understood to those having ordinary skill in the related art that in connection with a memory device and a manufacturing method thereof according to the embodiment described with reference to FIGS. 1 and 3 to 12, various substitutions, changes, and modifications may be made without departing from the technological spirit of the present invention. Therefore, the scope of the invention should not be determined by the described embodiments, but should be determined by the technological concepts described in the claims.

INDUSTRIAL APPLICABILITY

The embodiments of the present invention may be applied to the semiconductor/electronic devices and the manufacturing methods thereof. For example, the embodiments of the present invention may be applied to the memory devices and the methods of manufacturing them.

The invention claimed is:

1. A memory device comprising:

a first substrate structure including a plurality of sense amplifiers (S/A) and a peripheral circuit unit;

a second substrate structure bonded to a first surface side of the first substrate structure and including a first cell block including a plurality of first memory cells and a plurality of first bit lines; and a third substrate structure bonded to a second surface side of the first substrate structure and including a second cell block including a plurality of second memory cells and a plurality of second bit lines, wherein each of the plurality of first bit lines and each of the plurality of second bit lines are commonly connected to each of the plurality of sense amplifiers (S/A), wherein one first bit line among the plurality of first bit lines and one second bit line corresponding thereto among the plurality of second bit lines are connected to one sense amplifier among the plurality of sense amplifiers, and one of the one first bit line and the one second bit line is a bit line to be sensed and the other is a comparison bit line for voltage comparison.

2. The memory device of claim 1, wherein the first substrate structure includes a plurality of first contact pads arranged on the first surface side and a plurality of second contact pads arranged on the second surface side, wherein the plurality of first bit lines are respectively in contact with the plurality of first contact pads, and the plurality of second bit lines are respectively in contact with the plurality of second contact pads.

3. The memory device of claim 1, wherein the memory device is a three-dimensional stacked memory device.

4. The memory device of claim 1, wherein the memory device is a three-dimensional stacked DRAM device.

5. The memory device of claim 1, wherein at least some of the plurality of sense amplifiers (S/A) are arranged to be adjacent to each other in a first direction, wherein at least some of the plurality of first bit lines and at least some of the plurality of second bit lines corresponding thereto are arranged alternately along the first direction when observed from above.

6. The memory device of claim 5, wherein at least some of the plurality of second memory cells are arranged to be shifted by a given distance in the first direction or in a reverse direction thereof with respect to at least some of the plurality of first memory cells corresponding thereto.

7. The memory device of claim 1, wherein at least some of the plurality of sense amplifiers (S/A) are arranged to be adjacent to each other in a first direction, wherein at least some of the plurality of first bit lines and at least some of the plurality of second bit lines corresponding thereto are arranged to be spaced apart from each other or to be adjacent to each other in a second direction perpendicular to the first direction when observed from above.

8. The memory device of claim 7, wherein at least some of the plurality of second memory cells are arranged to be shifted by a given distance in the second direction or in a reverse direction thereof with respect to at least some of the plurality of first memory cells corresponding thereto.

9. The memory device of claim 1, wherein each of at least some of the plurality of first bit lines and each of at least some of the plurality of second bit lines corresponding thereto are arranged so that their positions coincide with each other when observed from above.

10. The memory device of claim 9, wherein each of at least some of the plurality of first memory cells and each of at least some of the plurality of second memory cells corresponding thereto are arranged so that their positions coincide with each other when observed from above.

11. The memory device of claim 1, wherein the first bit line and the second bit line commonly connected to one sense amplifier (S/A) have a same length.

12. The memory device of claim 11, wherein a length of a connection wiring from the first bit line to the sense amplifier (S/A) is same as a length of a connection wiring from the second bit line to the sense amplifier (S/A).

13. A manufacturing method of a memory device comprising:

preparing a first substrate structure including a plurality of sense amplifiers (S/A) and a peripheral circuit unit;

bonding a second substrate structure including a first cell block including a plurality of first memory cells and a plurality of first bit lines to a first surface side of the first substrate structure; and bonding a third substrate structure including a second cell block including a plurality of second memory cells and a plurality of second bit lines to a second surface side of the first substrate structure, wherein each of the plurality of first bit lines and each of the plurality of second bit lines are commonly connected to each of the plurality of sense amplifiers (S/A), wherein one first bit line among the plurality of first bit lines and one second bit line corresponding thereto among the plurality of second bit lines are connected to one sense amplifier among the plurality of sense amplifiers, and one of the one first bit line and the one second bit line is a bit line to be sensed and the other is a comparison bit line for voltage comparison.

14. The manufacturing method of a memory device of claim 13, wherein at least some of the plurality of sense amplifiers (S/A) are arranged to be adjacent to each other in a first direction, wherein at least some of the plurality of first bit lines and at least some of the plurality of second bit lines corresponding thereto are arranged alternately along the first direction when observed from above.

15. The manufacturing method of a memory device of claim 13, wherein at least some of the plurality of sense amplifiers (S/A) are arranged to be adjacent to each other in a first direction, wherein at least some of the plurality of first bit lines and at least some of the plurality of second bit lines corresponding thereto are arranged to be spaced apart from each other or to be adjacent to each other in a second direction perpendicular to the first direction when observed from above.

16. The manufacturing method of a memory device of claim 13, wherein each of at least some of the plurality of first bit lines and each of at least some of the plurality of second bit lines corresponding thereto are arranged so that their positions coincide with each other when observed from above.

17. The manufacturing method of a memory device of claim 13, wherein the first substrate structure includes a plurality of first contact pads arranged on the first surface side and a plurality of second contact pads arranged on the second surface side, wherein the plurality of first bit lines are respectively in contact with the plurality of first contact pads, and the plurality of second bit lines are respectively in contact with the plurality of second contact pads.

18. The manufacturing method of a memory device of claim 13, wherein the first substrate structure is a first wafer structure, the second substrate structure is a second wafer structure, and the third substrate structure is a third wafer structure.

19. The manufacturing method of a memory device of claim 13, wherein the memory device is a three-dimensional stacked memory device.

20. The manufacturing method of a memory device of claim 13, wherein the first bit line and the second bit line commonly connected to one sense amplifier (S/A) have a same length.

* * * * *